(12) United States Patent
Hernes et al.

(10) Patent No.: US 11,692,853 B2
(45) Date of Patent: Jul. 4, 2023

(54) ULTRA LOW POWER SOURCE FOLLOWER FOR CAPACITIVE SENSOR SHIELD DRIVERS

(71) Applicant: Disruptive Technologies Research AS, Blomsterdalen (NO)

(72) Inventors: Bjørnar Hernes, Trondheim (NO); Pål Øyvind Reichelt, Sandvika (NO)

(73) Assignee: Disruptive Technologies Research AS

( * ) Notice: Subject to any disclaimer, the term of this patent is extended or adjusted under 35 U.S.C. 154(b) by 348 days.

(21) Appl. No.: 15/400,536

(22) Filed: Jan. 6, 2017

(65) Prior Publication Data

US 2017/0191854 A1 Jul. 6, 2017

Related U.S. Application Data

(60) Provisional application No. 62/275,366, filed on Jan. 6, 2016.

(51) Int. Cl.
*G01R 27/26* (2006.01)
*G01D 5/24* (2006.01)
*H03K 17/955* (2006.01)

(52) U.S. Cl.
CPC .............. *G01D 5/24* (2013.01); *H03K 17/955* (2013.01)

(58) Field of Classification Search
USPC .................................................. 324/658–690
See application file for complete search history.

(56) References Cited

U.S. PATENT DOCUMENTS

| 6,563,235 B1 * | 5/2003 | McIntyre | ................ H02M 3/07 307/109 |
| 2011/0304576 A1 * | 12/2011 | Fasshauer | ............ H03K 17/955 345/174 |

* cited by examiner

*Primary Examiner* — Vincent Q Nguyen
(74) *Attorney, Agent, or Firm* — Onyx IP Group

(57) ABSTRACT

A source follower for a capacitive sensor device having a sense node and a shield node is provided. The source follower may include a transistor, and a switch array selectively coupling the transistor between the sense node and the shield node. The switch array may be configured to substantially disable current to the transistor during a first mode of operation, precharge the transistor during a second mode of operation, and enable the transistor to copy a sense node voltage to a shield node voltage during a third mode of operation.

20 Claims, 5 Drawing Sheets

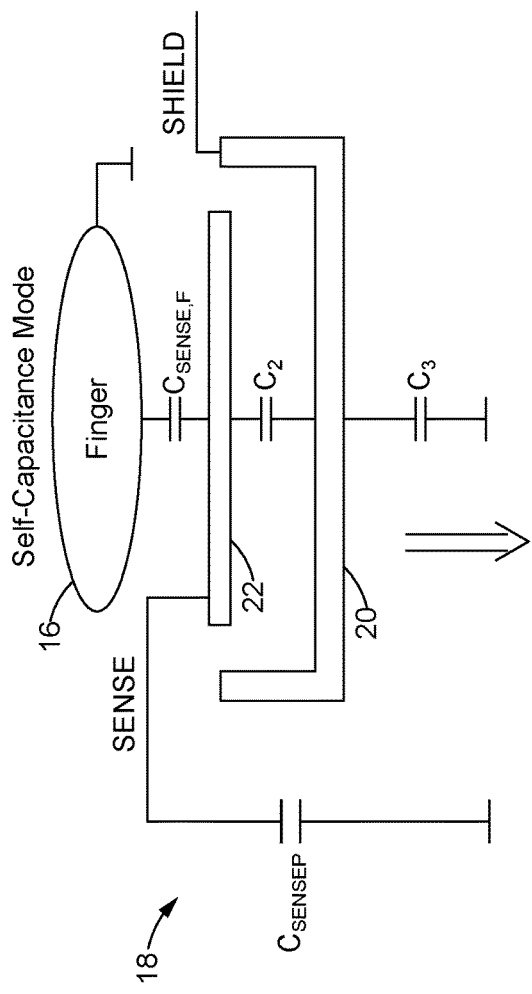
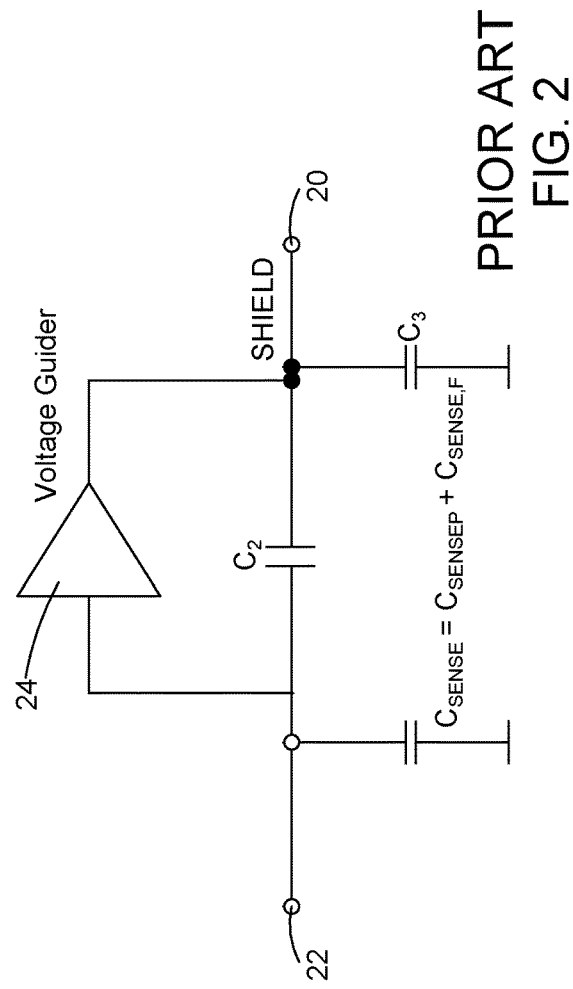
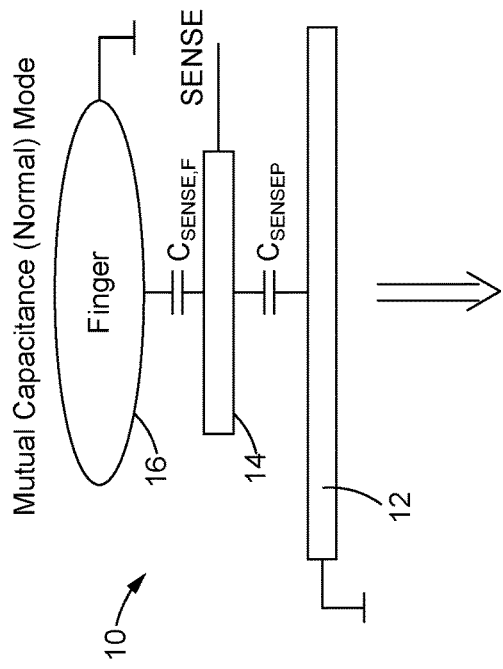
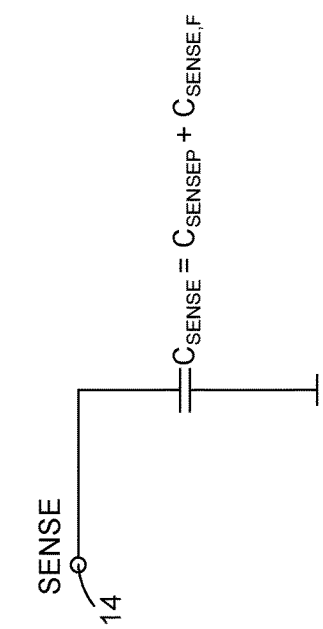
PRIOR ART
FIG. 1
PRIOR ART
FIG. 2

ULTRA LOW POWER SOURCE FOLLOWER FOR CAPACITIVE SENSOR SHIELD DRIVERS

TECHNICAL FIELD

The present disclosure relates generally to capacitive sensors, and more particularly, to ultra low power source followers for driving shielded capacitive touch sensors.

BACKGROUND

Capacitive sensor devices, or devices which measure capacitance or a change in capacitance, can be utilized in a wide variety of different fields. This is because various data or parameters that are sought by a given application can be derived based on capacitance or changes therein. For example, capacitive sensors can be used to detect touch, gesture or proximity input in human interface devices, to detect proximity of non-human physical objects, to detect presence and/or volume of water or other liquids, to detect motion, doors and windows for security applications, and any other application that exhibits some change in capacitance. While the following discussion will be directed to non-mechanical human interface devices for simplicity, it will be understood that the same discussions can be implemented for various other uses and applications.

Among various non-mechanical human interface devices used today, capacitive sensor devices are often used to detect and measure touch or proximity input. Typically, a capacitive touch sensor implements analog circuitry which measures changes in capacitance between two or more electrical wires caused by the proximity of a person's finger. The resulting analog signal representing the change in capacitance is digitized and post-processed to perform the preprogrammed task desired by the user. Although modern capacitive sensors may be adequate, new challenges surface when working with mobile or battery-operated devices.

Any battery-operated device shares the common goal of providing low power dissipation. While capacitive sensors may be modified to reduce power dissipation, the general trade-off or concern becomes an undesirable loss in the sensitivity of the capacitive sensor readouts and/or the addition of undesirable noise. One efficient technique of implementing capacitive sensor readouts is to charge the capacitive sensor with a constant current for a fixed duration, and to read the resulting voltage across the charged capacitor at the end of the fixed duration to detect touch or proximity input. Moreover, two modes of operating in accordance with this technique are conventionally known, a mutual-capacitance mode and a self-capacitance mode.

As shown in the prior art embodiment of FIG. 1, the mutual-capacitance mode circuit 10 is composed of a grounded node 12 and a sense node 14, which collectively exhibit a combined capacitance that may be composed of a parasitic capacitance $C_{SENSE,0}$ and a sense capacitance $C_{SENSE,F}$ reflective of touch or proximity input from a human finger 16 for instance. If the mutual-capacitance mode circuit 10 is appropriately designed, such that the sense capacitance $C_{SENSE,F}$ is sufficiently greater than the parasitic capacitance $C_{SENSE,0}$, touch input can be efficiently and accurately detected by the capacitive sensor readout. However, when used to detect proximity input, the mutual-capacitance mode circuit 10 drastically loses sensitivity and performs rather poorly due to the sense capacitance $C_{SENSE,F}$ diminishing to values decades smaller than the parasitic capacitance $C_{SENSE,0}$.

One solution to improve sensitivity is to implement the prior art self-capacitance mode circuit 18 shown in FIG. 2, which is generally composed of a shield node 20 that is used to substantially surround the sense node 22 and driven with a copy of the voltage at the sense node 22. This arrangement results in a parasitic capacitance CSENSE,0 that is only due to stray capacitance and insignificantly small. Furthermore, although this arrangement creates a new cross-capacitance C2 between the sense node 22 and the shield node 20, this cross-capacitance C2 is negated since the voltage applied to the shield node 20 copies or matches the voltage at the sense node 22. The end result is increased resolution of the sense capacitance $C_{SENSE,F}$, and thereby improved overall sensitivity that is more suitable for detecting proximity input at the sense node 22.

Although the self-capacitance mode circuit 18 of FIG. 2 is indeed an improvement, it can be further improved upon. Specifically, the self-capacitance mode circuit 18 copies the voltage between the sense node 22 and the shield node 20 using a voltage buffer 24. A voltage buffer 24 is often implemented by an operational amplifier connected in unity gain. However, such an operational amplifier is composed of numerous transistors, all of which can introduce unwanted noise. While the noise generated by the operational amplifier can be reduced, such noise reduction then comes with increased power dissipation, which is a significant drawback for battery-operated and/or mobile devices. Thus, it may be beneficial to modify the traditional self-capacitance mode circuit 18, and to substitute the operational amplifier with a better means for driving shielded capacitive sensors operating in self-capacitance mode.

The present disclosure is directed at addressing one or more of the deficiencies and disadvantages set forth above. However, it should be appreciated that the solution of any particular problem is not a limitation on the scope of this disclosure or of the attached claims except to the extent expressly noted.

SUMMARY OF THE DISCLOSURE

In one aspect of the present disclosure, a source follower for a capacitive sensor device having a sense node and a shield node is provided. The source follower may include a transistor, and a switch array selectively coupling the transistor between the sense node and the shield node. The switch array may be configured to substantially disable current to the transistor during a first mode of operation, precharge the transistor during a second mode of operation, and enable the transistor to copy a sense node voltage to a shield node voltage during a third mode of operation.

In another aspect of the present disclosure, a capacitive sensor device is provided. The capacitive sensor device may include sense node having a combined capacitance at least partially corresponding to proximity input, a shield node partially surrounding the sense node, having a shield capacitance and forming a cross-capacitance with the sense node, and a source follower coupled between the sense node and the shield node. The source follower may be configured to substantially disable current during a first mode of operation, precharge during a second mode of operation, and copy a sense voltage to a shield node voltage during a third mode of operation.

In yet another aspect of the present disclosure, a method of providing a source follower for a capacitive sensor device having a sense node and a shield node is provided. The method may include providing a transistor selectively coupled between the sense node and the shield node via a switch array, enabling the switch array in a manner configured to define a first mode of operation, a second mode of operation, and a third mode of operation, disabling current to the transistor during the first mode of operation, precharging the transistor during the second mode of operation, and enabling the transistor to copy the sense node voltage to a shield node voltage during a third mode of operation.

These and other aspects and features will be more readily understood when reading the following detailed description in conjunction with the accompanying drawings.

BRIEF DESCRIPTION OF THE DRAWINGS

FIG. 1 is a schematic view of a prior art embodiment of a capacitive sensor device arranged in a mutual-capacitance mode;

FIG. 2 is a schematic view of a prior art embodiment of a capacitive sensor device arranged in a self-capacitance mode;

While the following detailed description is given with respect to certain illustrative embodiments, it is to be understood that such embodiments are not to be construed as limiting, but rather the present disclosure is entitled to a scope of protection consistent with all embodiments, modifications, alternative constructions, and equivalents thereto.

DETAILED DESCRIPTION

Figure 3:
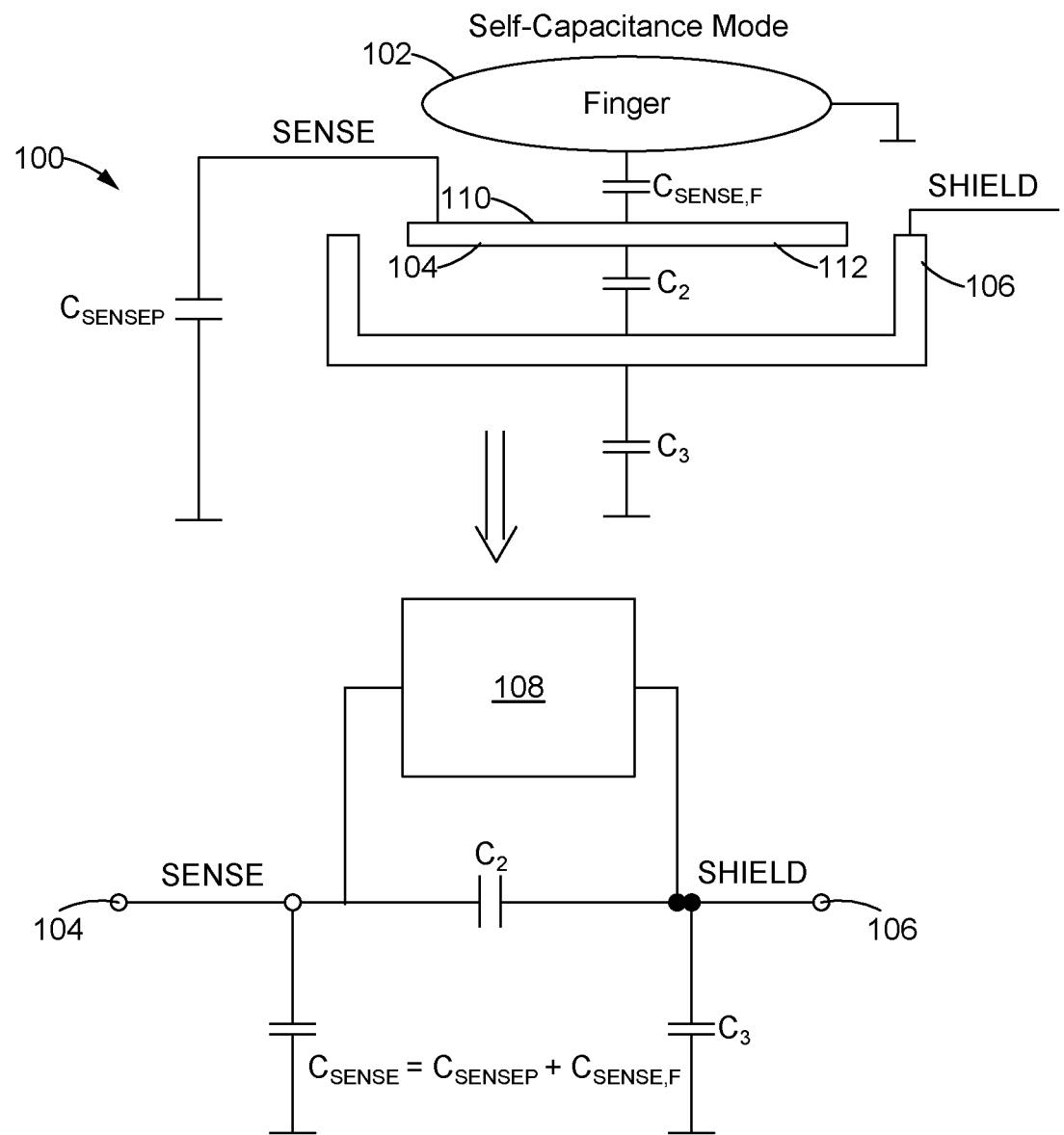
FIG. 3 is a schematic view of one exemplary capacitive sensor device arranged in a self-capacitance mode with a source follower of the present disclosure.

Referring to FIG. 3, one exemplary embodiment of a capacitive sensor device 100 is diagrammatically provided. In general, the capacitive sensor device 100 may be used to monitor for changes in capacitance responsive to touch input, and more particularly to proximity input, such as via a human finger 102, and provide an analog output such as in the form of a voltage on a sense node corresponding to the detected touch or proximity input. Moreover, the capacitive sensor device 100 shown may be incorporated or implemented within mobile or battery-operated devices, or any other form of electronic devices configured to receive some form of touch or proximity input from a user, and perform a preprogrammed task in response to the touch or proximity input. As shown, the capacitive sensor device 100 may generally include a sense node 104, a shield node 106, and a source follower 108 that is constructed according to the present disclosure and designed to take place of a conventional voltage buffer.

More specifically, as shown in FIG. 3, the sense node 104 may exhibit a parasitic capacitance $C_{SENSE,0}$ with ground, and a sense capacitance $C_{SENSE,F}$ that is variably induced by proximity input from a finger 102, or the like. The shield node 106 may be arranged to at least partially surround the sense node 104. For example, the sense node 104 may include an upper surface 110 for interfacing with proximity input and a lower surface 112 for interfacing with the shield node 106. The shield node 106 may be positioned to be underneath, separated from and substantially surrounding the lower surface 112 of the sense node 104. In addition, the shield node 106 may exhibit a shield capacitance $C_3$ with ground and form a cross-capacitance $C_2$ with the sense node 104. Furthermore, the source follower 108 may be coupled between the sense node 104 and the shield node 106 and essentially copy the voltage at the sense node 104 to the shield node 106.

Figure 4:
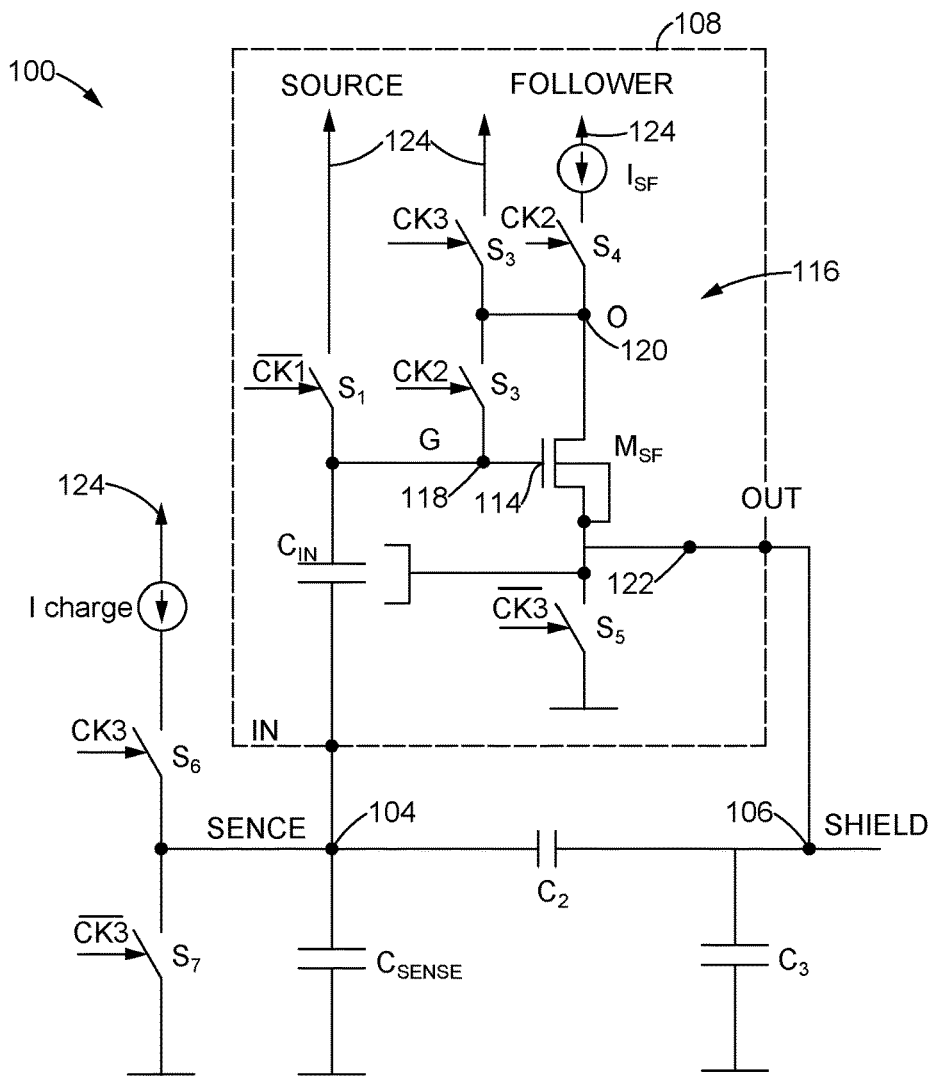
FIG. 4 is a schematic view of one exemplary embodiment of a source follower of the present disclosure for driving a shield of a capacitive sensor device in self-capacitance mode.

Turning now to FIG. 4, the source follower 108 of FIG. 3 is disclosed in more detail. The source follower 108 may be designed to take place of the voltage buffer 24 implemented by an operational amplifier of the prior art self-capacitance mode circuit 18 in FIG. 2 and provide various benefits, such as reduced power dissipation and reduced noise, all while increasing sensitivity to levels sufficient for detecting proximity input. As shown, the source follower 108 may further include a transistor 114 and a switch array 116 which, in the embodiment of FIG. 4 may include switches S1-S7. The switch array 116 may generally be configured to selectively couple the transistor 114 between the sense node 104 and the shield node 106 in a manner intended to essentially copy the voltage on the sense node 104 to the shield node 106.

Figure 5:
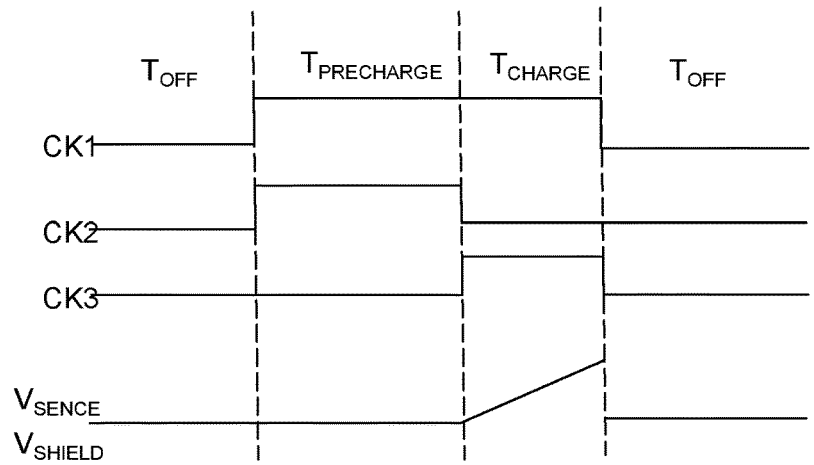
FIG. 5 is a diagrammatic view of a timing diagram for operating the source follower of FIG. 4.

Moreover, as illustrated for example in FIG. 5, the switch array 116 may configure the transistor 114 to operate in one of multiple modes of operation, such as to substantially disable current during a first mode of operation $T_{OFF}$, precharge during a second mode of operation $T_{PRECHARGE}$, and copy a sense voltage $V_{SENSE}$ to a shield voltage $V_{SHIELD}$ during a third mode of operation $T_{CHARGE}$.

Still referring to FIG. 4, the transistor 114 may be an N-type metal-oxide semiconductor (NMOS), including a gate 118, a drain 120 and a source 122, and configured to interact with the plurality of switches S1-S7 of the switch array 116. For instance, the switch array 116 may be configured to selectively couple the gate 118 between one or more of the supply voltage 124, a source follower current $I_{SF}$, and an input capacitance $C_{IN}$. The switch array 116 may also be configured to selectively couple the drain 120 between the source follower current $I_{SF}$ and the supply voltage 124. Additionally, the switch array 116 may be configured to selectively couple the source 122 between ground and the shield node 106. As shown in FIG. 5, the switch array 116 may be reiteratively and periodically enabled according to the first mode of operation $T_{OFF}$, the second mode of operation $T_{PRECHARGE}$, and the third mode of operation $T_{CHARGE}$, as collectively defined by a plurality of clock signals CK1-CK3.

Figures 6, 7, 8:
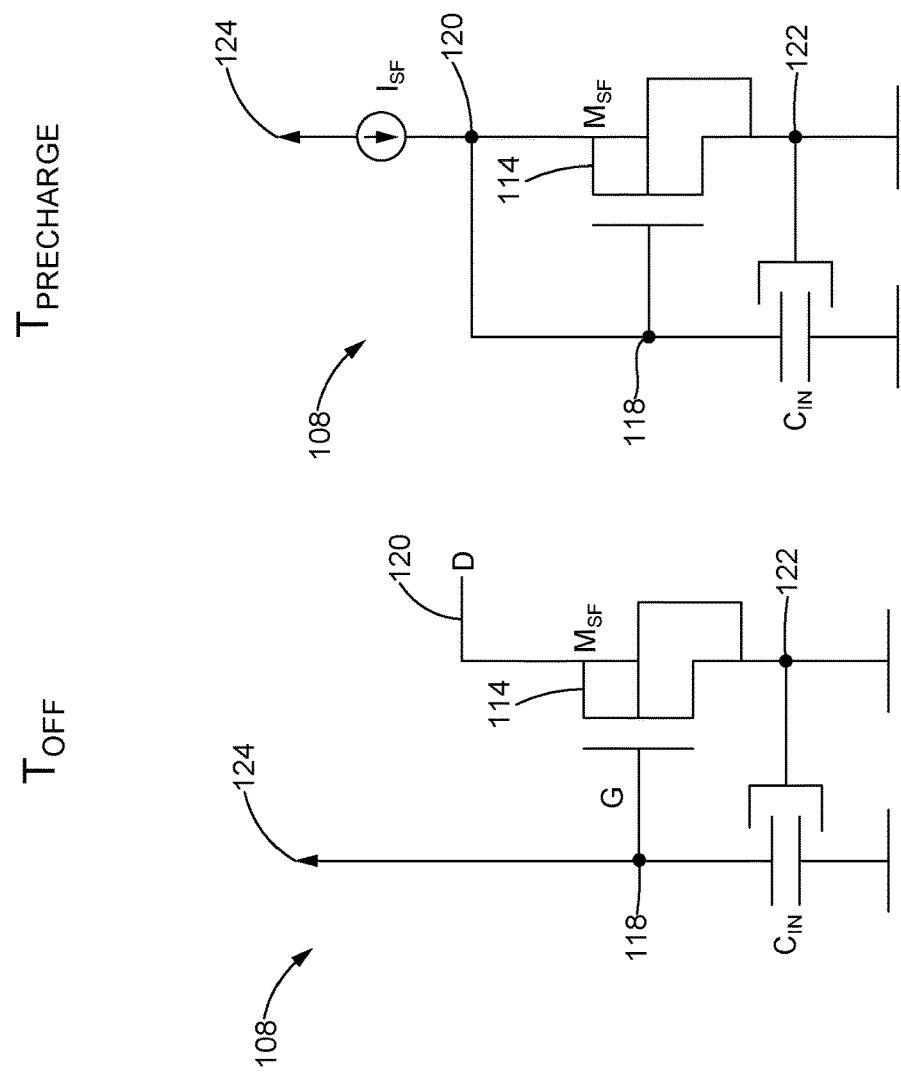
FIG. 6 is a schematic view of the source follower of FIG. 4 in a first mode of operation.
FIG. 7 is a schematic view of the source follower of FIG. 4 in a second mode of operation.
FIG. 8 is a schematic view of the source follower of FIG. 4 in a third mode of operation.

Exemplary embodiments of the source follower 108 at different stages of operation are respectively illustrated in more detail in FIGS. 6-8. As shown in FIG. 6, during the first mode of operation $T_{OFF}$, all clocks signals CK1-CK3 are disabled or logically low, and the source follower 108 does not consume any current. More particularly, switches S1, S5 and S7 are enabled or closed to short the gate 118 to the supply voltage 124, and to short each of the sense node 104 and the shield node 106 to ground. The drain 120 may be left floating and drawn to 0V since the transistor 114 is enabled, and the source 122 may remain coupled to ground. Furthermore, the gate 118 and the input capacitance $C_{IN}$ are precharged by the supply voltage 124. Correspondingly, as referenced in FIG. 5, each of the sense voltage $V_{SENSE}$ and the shield voltage $V_{SHIELD}$ remains disabled or at a logical low value, such as 0V.

During the second mode of operation $T_{PRECHARGE}$ in FIG. 7, the first and second clock signals CK1 and CK2 are enabled or logically high, while the third clock signal CK3 is disabled or logically low. For instance, the rising edge of the first clock signal CK1 disables or opens switch S1, while the rising edge of the second clock signal CK2 enables or closes switches S3 and S4 to couple the gate 118 to the source follower current $I_{SF}$ and enable the transistor 114 to operate as a diode. Because the gate 118 was precharged with the supply voltage 124, the voltage on the gate 118 may quickly settle to the value set by the transistor 114 while the current at the drain 120 may be set by the source follower current $I_{SF}$. Furthermore, the input capacitance $C_{IN}$ is precharged to the voltage across the gate 118 and the source 122, and the source 122 remains grounded. As shown in FIG. 5, each of the sense voltage $V_{SENSE}$ and the shield voltage $V_{SHIELD}$ still remains disabled or at a logical low value.

During the third mode of operation $T_{CHARGE}$ shown in FIG. 8, the first and third clock signals CK1 and CK3 are enabled or logically high, and the second clock signal CK2 is disabled or logically low, which enables or closes switches S2 and S6. A fixed current $I_{CHARGE}$ is then applied to the sense node 104 to charge the capacitive sensor device 100, and the sense voltage $V_{SENSE}$ increases as in FIG. 5. Furthermore, the voltage at the gate 118 may shift from the sense voltage $V_{SENSE}$ with the voltage across the gate 118 and the source 122 previously acquired during the second mode of operation $T_{PRECHARGE}$, and the shield voltage $V_{SHIELD}$ may shift down from the gate 118 by the voltage across the gate 118 and the source 122. When the source follower current $I_{SF}$ becomes approximately equal to the current required to charge the shield capacitance C3, the shield voltage $V_{SHIELD}$ substantially copies or becomes approximately equal to the sense voltage $V_{SENSE}$ as shown in FIG. 5.

According to the foregoing, as only one transistor 114 is employed in driving the shield node 106, the number of possible sources for noise as well as the number of current paths drawing current from the supply voltage 124 are significantly reduced. Additionally, the source follower 108 is completely off and no current is drawn when not in use. Substantially all of the current drawn, except for a minimal amount of current consumed during the second mode of operation $T_{PRECHARGE}$, is allocated to charging the capacitive sensor device 100. Furthermore, in order to obtain a unity gain from the sense node 104 to the shield node 106 and to minimize the parasitic capacitance between the gate 118 and ground, the shield of the input capacitance $C_{IN}$ is coupled to the output of the source follower 108.

In alternative embodiments, switch S6 may be operated by the first clock signal CK1 instead of the third clock signal CK3 to allow the fixed current $I_{CHARGE}$ to settle before the third mode of operation $T_{CHARGE}$. In other alternatives, the source follower current $I_{SF}$ may be implemented as a current digital-to-analog converter (DAC) such that the precharge current of the transistor 114 can be varied or adjusted according to the requirements of the shield node 106. In related modifications, the current DAC may be varied or adjusted according to the output of a calibration algorithm configured to optimize the performance of the capacitive sensor device 100, or any readout circuit associated therewith. While only certain embodiments, circuit arrangements and operating modes are depicted, it will be understood that other variations are possible without departing from the scope of the appended claims.

Figure 9:
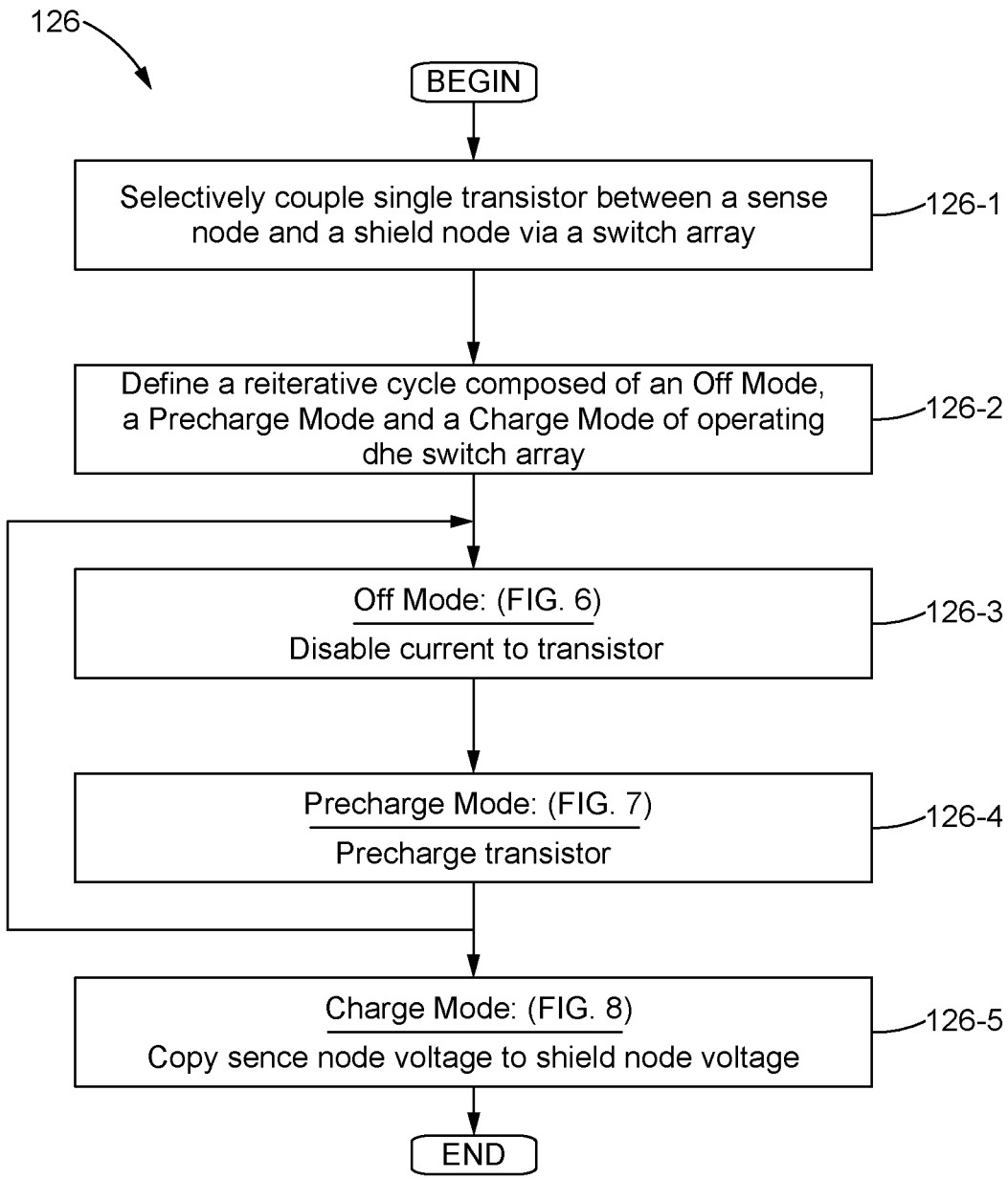
FIG. 9 is a flow diagram of one exemplary scheme or method of providing and controlling a source follower for a capacitive sensor device in a self-capacitance mode.

Turning now to FIG. 9, one exemplary method 126 of providing and operating a source follower 108 for a capacitive sensor device 100 having a sense node 104 and a shield node 106 is provided. As shown, the method 126 in block 126-1 may simply provide for a transistor 114 that is selectively coupled between a sense node 104 and a shield node 106 via a switch array 116 as shown for instance in FIG. 4. The method 126 in block 126-2 may define a reiterative and periodic cycle of events by which the switch array 116 may be operated. As shown in FIG. 5, for example, a plurality of clock signals CK1-CK3 may be generated which collectively enable and disable switches S1-S7 within the switch array 116 in a manner configured to define a first mode of operation $T_{OFF}$, a second mode of operation $T_{PRECHARGE}$, and a third mode of operation $T_{CHARGE}$.

Once the cycle is initiated, such as when the associated capacitive sensor device 100 is powered on, the method 126 may reiteratively cycle through the first mode of operation $T_{OFF}$, the second mode of operation $T_{PRECHARGE}$, and the third mode of operation $T_{CHARGE}$, in the sequence shown in FIG. 5. In particular, during the Off Mode, or the first mode of operation $T_{OFF}$, the method 126 in block 126-3 may disable current to the transistor 114. For instance, the clock signals CK1-CK3 may operate the switch array 116 according to the embodiments illustrated in FIGS. 5 and 6 discussed above. During the Precharge Mode, or the second mode of operation $T_{PRECHARGE}$, the method 126 in block 126-4 may precharge the transistor 114. More specifically, the clock signals CK1-CK3 may operate the switch array 116 according to the embodiments illustrated in FIGS. 5 and 7 discussed above.

Still further, during the Charge Mode, or the third mode of operation $T_{CHARGE}$, the method 126 in block 126-5 of FIG. 9 may enable the transistor 114 so as to copy the voltage at the sense node 104 to the shield node 106. For example, the clock signals CK1-CK3 may be configured to operate the switch array 116 according to the embodiments illustrated in FIGS. 5 and 8 discussed above. Once the Charge Mode, or the third mode of operation $T_{CHARGE}$ is complete, the method 126 may loop back to the Off Mode, or the first mode of operation $T_{OFF}$, and continue repeating the process until the capacitive sensor device 100 is disabled or powered down. It will be understood that the method 126 shown in FIG. 9 is demonstrative of only one exemplary set of processes configured to provide and enable the capacitive sensor device 100 discussed further above, and that other variations of the method 126 will be apparent to those of ordinary skill in the art.

From the foregoing, it will be appreciated that while only certain embodiments have been set forth for the purposes of illustration, alternatives and modifications will be apparent from the above description to those skilled in the art. These and other alternatives are considered equivalents and within the spirit and scope of this disclosure and the appended claims.

What is claimed is:

1. A method comprising:
   providing a source follower coupled between a sense node of a capacitive sensor device and a shield node of the capacitive sensor device via a switch array of the source follower,
   wherein the source follower includes a transistor and a switch array,
   wherein the switch array selectively couples the transistor between the sense node and the shield node, wherein the switch array selectively couples a gate of the transistor between one or more of a supply voltage of the capacitive sensor device, a source follower current of the capacitive sensor device, and an input capacitance of the capacitive sensor device, wherein the switch array selectively couples a drain of the transistor between the supply voltage and the source follower current, and wherein the switch array selectively couples a source of the transistor between ground of the capacitive sensor device and the shield node to copy a sense node voltage of the sense node to the shield node;

enabling the switch array in a manner configured to define a first mode of operation, a second mode of operation, and a third mode of operation;

disabling current to the transistor during the first mode of operation, wherein, during the first mode of operation, the gate is shorted to the supply voltage and the sense node and the shield node is shorted to the ground;

precharging the transistor during the second mode of operation, wherein, during the second mode of operation, the gate is coupled to the source follower current; and enabling the transistor to cause the sense node voltage of the sense node to be substantially equal to a shield node voltage of the shield node during a third mode of operation.

2. The method of claim 1, wherein the switch array is enabled according to a plurality of clock signals enabled to collectively define the first mode of operation, the second mode of operation, and the third mode of operation.

3. The method of claim 2, wherein the clock signals are periodically reiterated to sequentially cycle through the first mode of operation, the second mode of operation, and the third mode of operation.

4. The method of claim 2, wherein, during the first mode of operation, the gate and the input capacitance are precharged to the supply voltage, the drain is floating, and the source is coupled to the ground.

5. The method of claim 2, wherein, during the second mode of operation, the gate is coupled to the source follower current and allowed to settle, the drain is coupled to the source follower current, the source is coupled to the ground, and the input capacitance is precharged to a gate-source voltage of the transistor.

6. The method of claim 2, wherein, during the third mode of operation, the sense node is coupled to a fixed supply current, the drain is coupled to the supply voltage, and the source is coupled to the shield node.

7. The method of claim 1, further comprising:
disabling the current to the transistor during the first mode of operation after enabling the transistor to cause the sense node voltage to be substantially equal to the shield node voltage during the third mode of operation.

8. A capacitive sensor device comprising:
a sense node;
a shield node; and
a source follower coupled between the sense node and the shield node,
wherein the source follower includes a transistor and a switch array,
wherein the switch array selectively couples the transistor between the sense node and the shield node,
wherein the switch array selectively couples a gate of the transistor between one or more of a supply voltage of the capacitive sensor device, a source follower current of the capacitive sensor device, and an input capacitance of the capacitive sensor device, wherein the switch array selectively couples a drain of the transistor between the supply voltage and the source follower current, wherein the switch array selectively couples a source of the transistor between ground of the capacitive sensor device and the shield node to copy a sense node voltage of the sense node to the shield node, wherein, during a first mode of operation, the gate is shorted to the supply voltage and the sense node and the shield node is shorted to the ground, wherein, during a second mode of operation, the gate is coupled to the source follower current, and wherein, during a third mode of operation, the sense node voltage of the sense node is substantially equal to a shield node voltage of the shield node.

9. The capacitive sensor device of claim 8, wherein the switch array is enabled according to a plurality of clock signals enabled to collectively define the first mode of operation, the second mode of operation, and the third mode of operation.

10. The capacitive sensor device of claim 9, wherein the clock signals are periodically reiterated to sequentially cycle through the first mode of operation, the second mode of operation, and the third mode of operation.

11. The capacitive sensor device of claim 9, wherein, during the first mode of operation, the gate and the input capacitance are precharged to the supply voltage, the drain is floating, and the source is coupled to the ground.

12. The capacitive sensor device of claim 9, wherein, during the second mode of operation, the gate is coupled to the source follower current and allowed to settle, the drain is coupled to the source follower current, the source is coupled to the ground, and the input capacitance is precharged to a gate-source voltage of the transistor.

13. The capacitive sensor device of claim 9, wherein, during the third mode of operation, the sense node is coupled to a fixed supply current, the drain is coupled to the supply voltage, and the source is coupled to the shield node.

14. The capacitive sensor device of claim 8, wherein the current to the transistor is disabled during the first mode of operation after enabling the transistor to cause the sense node voltage to be substantially equal to the shield node voltage during the third mode of operation.

15. A source follower comprising:
a transistor; and
a switch array,
wherein the source follower is coupled between a sense node of a capacitive sensor device and a shield node of the capacitive sensor device,
wherein the switch array selectively couples the transistor between the sense node and the shield node,
wherein the switch array selectively couples a gate of the transistor between one or more of a supply voltage of the capacitive sensor device, a source follower current of the capacitive sensor device, and an input capacitance of the capacitive sensor device,
wherein the switch array selectively couples a drain of the transistor between the supply voltage and the source follower current,
wherein the switch array selectively couples a source of the transistor between ground of the capacitive sensor device and the shield node to copy a sense node voltage of the sense node to the shield node, wherein, during a first mode of operation, the gate is shorted to the supply voltage and the sense node and the shield node is shorted to the ground, wherein, during a second mode of operation, the gate is coupled to the source follower current, and wherein, during a third mode of operation, the sense node voltage of the sense node is substantially equal to a shield node voltage of the shield node.

16. The source follower of claim 15, wherein the switch array is enabled according to a plurality of clock signals enabled to collectively define the first mode of operation, the second mode of operation, and the third mode of operation.

17. The source follower of claim 16, wherein the clock signals are periodically reiterated to sequentially cycle through the first mode of operation, the second mode of operation, and the third mode of operation.

18. The source follower of claim 16, wherein, during the first mode of operation, the gate and the input capacitance are precharged to the supply voltage, the drain is floating, and the source is coupled to the ground.

19. The source follower of claim 16, wherein, during the second mode of operation, the gate is coupled to the source follower current and allowed to settle, the drain is coupled to the source follower current, the source is coupled to the ground, and the input capacitance is precharged to a gate-source voltage of the transistor.

20. The source follower of claim 16, wherein, during the third mode of operation, the sense node is coupled to a fixed supply current, the drain is coupled to the supply voltage, and the source is coupled to the shield node.

* * * * *